United States Patent [19]
Herrick

[11] Patent Number: 5,601,687
[45] Date of Patent: Feb. 11, 1997

[54] MASK DESIGN

[75] Inventor: Robert W. Herrick, Santa Barbara, Calif.

[73] Assignee: The United States of America as represented by the Secretary of the Air Force, Washington, D.C.

[21] Appl. No.: 526,857

[22] Filed: Sep. 11, 1995

[51] Int. Cl.⁶ .................................................. H01L 21/47
[52] U.S. Cl. ........................... 156/644.1; 156/657.1; 156/659.11; 437/228
[58] Field of Search ........................... 156/644.1, 655.1, 156/657.1, 659.11; 437/129, 203, 228; 148/DIG. 68, DIG. 95; 372/48, 49, 72

[56] References Cited

U.S. PATENT DOCUMENTS

| | | | |
|---|---|---|---|
| 4,029,531 | 6/1977 | Marinelli | 156/659.11 |
| 4,219,835 | 8/1980 | Van Loon et al. | 148/DIG. 53 |
| 4,389,429 | 6/1983 | Soclof | 437/203 |
| 4,420,874 | 12/1983 | Funatsu | 156/657.1 |
| 4,595,454 | 6/1986 | Dautremont-Smith et al. | 156/655.1 |
| 4,626,613 | 12/1986 | Wenham et al. | 437/203 |
| 4,665,525 | 5/1987 | Ackley et al. | 437/203 |
| 4,759,823 | 7/1988 | Asselanis et al. | 156/659.1 |
| 4,911,784 | 3/1990 | Hensel et al. | 156/643 |
| 4,969,712 | 11/1990 | Westwood et al. | 350/96.11 |
| 4,992,137 | 2/1991 | Cathey, Jr. et al. | 156/643 |

FOREIGN PATENT DOCUMENTS 1-220492  9/1989  Japan .

*Primary Examiner*—R. Bruce Breneman
*Assistant Examiner*—Anita Alanko
*Attorney, Agent, or Firm*—William G. Auton

[57] ABSTRACT

A device and a method to minimize leakage current between adjacent sections of a semiconductor device, while minimizing topographic variations. The device has an etched shape of a diamond, with an unetched "moat" in its center. While any type of etch will work, wet etching is usually used, both for its low cost and its good sidewell smoothness. Prior designs typically have a simple straight line (T-shape) across. The etching has general application to wafer fabrication of opto-electronic devices requiring good electrical isolation, and using self-aligned or planarization processing in later process step which require minimal topographic variations. More generally, the design technique can be applied to any etched semiconductor device where topographic variation needs to be minimized while using wet etching or other crystallographic etches. The novel features include the elimination of any lines along the 011 crystallographic axis (which give retrograde slopes in wet etching) and the use of an "island-to-fill-in" feature, and minimize volume of absorbed resists.

2 Claims, 5 Drawing Sheets

IMPROVED DESIGN

IMPROVED DESIGN     IMPROVED DESIGN

ORIGINAL DESIGN

IMPROVED DESIGN

APPROXIMATE MODE SHAPE (0.4 x 4-8 μm)  V-GROOVE DEPTH: 2-2.5 μm WIDTH: 5 μm  APPROXIMATE "T" WIDTH: 15 μm (60% OF AREA)

A

ORIGINAL DESIGN

B

ORIGINAL DESIGN

V-GROOVE DEPTH: 1-1.5 μm WIDTH: 2 μm  ~60% OF LONGITUDINAL CURRENT BLOCKED (SAME AS ORIGINAL DESIGN)

C

IMPROVED DESIGN

D

IMPROVED DESIGN

MASK DESIGN

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to semiconductors, and more specifically the invention pertains to a device and method to minimize current leakage between adjacent sections of a semiconductor device, while minimizing topographic variations.

Advanced semiconductor devices have increasingly complex layouts, which often include multiple contacts to allow sections of the device to be independently controlled. Some form of electrical isolation between these sections is desirable, or even necessary, in many cases. While integrated circuits often use ion implants for such isolation, this is often not desirable for the small-scale production typically done with semiconductor lasers, due to the difficulty and expense of ion implantation. The simplest method of electrically isolating multiple contacts is to etch the contact layers (usually p-type) that connect them. In most cases, forming v-grooves by wet etching is the simplest form of etching. (Dry etching may also be used, but etch damage typically results in lower reverse breakdown voltage, and higher leakage currents.) For semiconductor laser devices, wet-etched v-grooves have the added benefit of suppressing parasitic lasing across the laser which often happens in wide lasers without v-grooves.

Unfortunately, the most straight-forward designs for v-groove patterns carry with them (unanticipated) negative consequences. Most notably, when combined with the widely-used self-aligned contact schemes (which rely on photoresist planarization and uniform etch back to expose only the tops of the ridge waveguides), standard designs prove very difficult to implement. More generally, maintaining device planarity is important for a wide variety of integrated electronic applications, due to the difficulty in obtaining step coverage in non-planar wafers.

The task of minimizing leakage of current between adjacent sections of semiconductors is alleviated, to some extent, by the systems disclosed in the following U.S. Patents, the disclosures of which are incorporated herein by reference:

U.S. Pat. No. 4,992,137 issued to Cathey, et al;
U.S. Pat. No. 4,969,712 issued to Westwood, et al;
U.S. Pat. No. 4,911,784 issued to Hensel, et al;
U.S. Pat. No. 4,759,823 issued to Asselanis et al;

The patents to Cathey et al, Westwood et al, Hensel et al, and Asselanis et al disclose etching on semiconductors but do not disclose shapes. While these references are instructive, a need remains to improve device planarity wherever etched trenches are needed (e.g., to spoil parasitic lasing, or for electrical isolation). The present invention is intended to satisfy that need.

SUMMARY OF THE INVENTION

The present invention is a device and a method that will minimize leakage current between adjacent sections of a semiconductor device, while minimizing topographic variations. The device has etched the shape of a diamond, with an unetched "moat" in its center. While any type of etch will work, wet etching is usually used, both for its low cost and its good sidewall smoothness. Prior designs typically have a simple straight line (T-shape) across. The etching has general application to wafer fabrication of opto-electronic devices requiring good electrical isolation, and using self-aligned or planarization processing in later process step which require minimal topographic variations. More generally, the design technique can be applied to any etched semiconductor device where topographic variation needs to be minimized while using wet etching or other crystallographic etches. The novel features are the elimination of any lines along the 011 crystallographic axis (which gives retrograde slopes in wet etching) and the use of an "island to fill-in" feature, and minimize volume of absorbed resists.

It is an object of the present invention to provide a system that will minimize current leakage between adjacent sections of a semiconductor device.

It is another object of the present invention to improve device planarity in semiconductors whenever etched trenches are needed.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention includes a mask design that eliminates the surface topography problems encountered with the standard approach. Our approach focuses on two key principles: first, minimize the volume of material etched in the v-groove, to maintain a near-planar surface; and second, avoid mask openings in the 011 (or 110) direction which result in undercut "keyhole" profiles. The rationale behind these two principles, and the consequences of using more standard design approaches, are described in more detail below.

Figure 1:
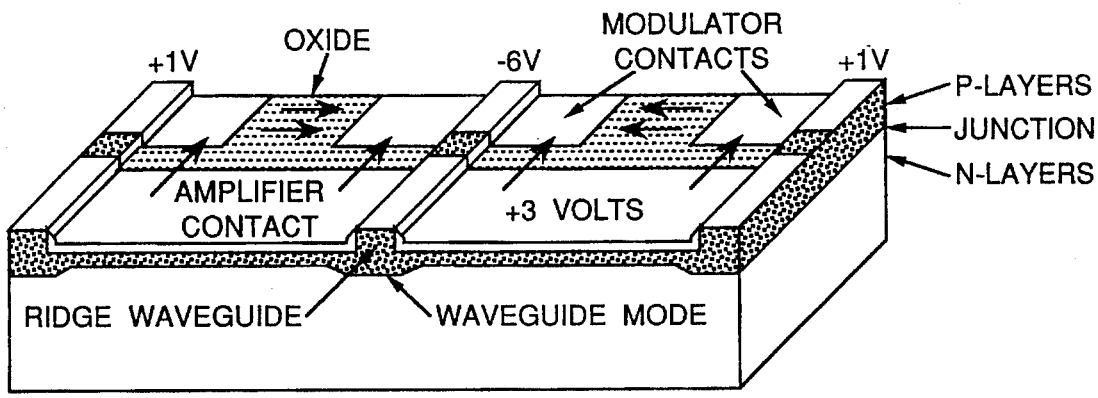
FIG. 1 is an illustration of a prior art semiconductor that forms a travelling wave amplifier.

The reader's attention is now directed towards FIG. 1, which is an illustration of a prior art travelling wave amplifier device, which has a simple, straight line (T-shape) ridge structure without the v-grooves of the present invention. This system suffers from leakage between the sections.

The system of FIG. 1 was designed to produce a high-power, diffraction-limited output, using single-quantum-well semiconductor laser material. A high-quality master-oscillator signal is injected into the input port, and amplified and split to 400 channels. Each of the 400 channels has independent phase control, with voltage ranging between +2 and −10 V. The phase-corrected signals are then amplified in a 2-mm-long amplifier section to ~25 mW per channel. The applied voltage on the splitter section (preceding the modulators) and the amplifier section (following the modulators) is roughly +2 to +3 V.

In the system of FIG. 1 there are multiple channels, and it is hoped that roughly 10 W of output power can be obtained.

Controlling the modulator channels is ideally done using a small Application-Specific Integrated Circuit (ASIC). Unfortunately, thermal constraints limit the current output of such a chip to only a few milliamps per modulator channel. As we shall see below, without isolation between the channels, leakage current between channels can be far larger than the driver's capability.

Let us consider the worst case: a modulator at −10 V, with its neighbors on both sides at +2 V. (With typical random phase variations, this would be expected at several locations on the chip.) The spacing between ridge centers is 25 um (microns); since the ridges are roughly 3 um wide, the distance between the ridge edges is roughly 22 um. There is roughly 0.2 μm of p-doped cladding material above the ridge, with a doping of approximately $2\times10^{17}$ cm$^{-3}$. The modulator is a 1-mm-long ridge.

By looking up the resistivity of p-type GaAs from a graph (c.f. S. M. Sze, *Physics of Semiconductor Devices*, 2e, p. 33.), we see that $2\times10^{17}$ cm$^{-3}$ correlates to 0.15 ohm –cm resistivity. We now have all the information we need to calculate the resistance between channels.

We use the formula R=pl/A,
where R is the resistance, p is the resistivity, 1 is the distance electrons must travel (in this case the 22 μm between ridges), and A is the cross-sectional area they can flow in (in this case the 0.2×1000 μm sheet between modulators). Our result is consistent with the 150 r resistance measured on actual test devices in the lab. Using Ohm's law, we can calculate the resulting leakage current: I=V/R where the voltage differential V in this case is 2-(-10) V=12 V, and so I=80 mA of leakage out of each side of the ridge, for a total of 160 mA. This is about an order of magnitude greater than the maximum drive current, and thus is clearly unacceptable.

The simplest fix would use an isolation implant (impractical for production in our situation) or an etch. The etching can be dry etching or wet etching. Our experience has been that both cleaved and dry-etched facets often have imperfections that result in substantial leakage currents to ground. However, wet-etched trenches (v-grooves) are featureless, and show no such leakage. Further, v-grooves will prevent lateral parasitic lasing by interrupting light traveling crosswise on the chip.

Figure 2:
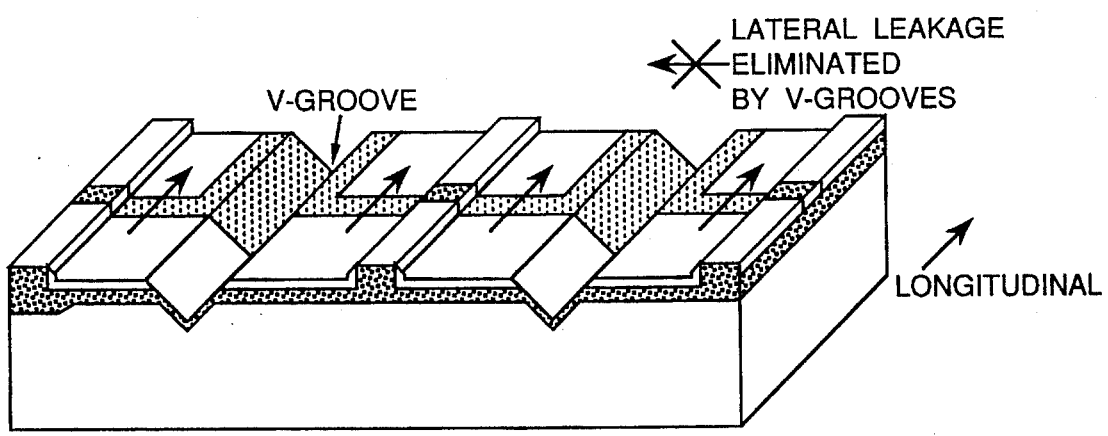
FIG. 2 is an illustration of a semiconductor mask design that eliminates lateral leakage but not longitudinal leakage currents.

The reader's attention is now directed towards FIG. 2, which is a mask design that uses the principle of the present invention, and which is intended to replace the system of FIG. 1.

In FIG. 2 the v-grooves prevent lateral leakage currents (between modulators) but not longitudinal leakage (between sections). More elaborate designs (described in text but not pictured here) reduce such leakage.

While these v-grooves will eliminate modulator-to-modulator leakage, there is still the issue of leakage from the modulator ends to both the amplifier and splitter regions. This time, the length between sections is only 20 um, the thickness of the conducting layer again 0.2 um, and the width 25 um, yielding an effective resistance of 8 kilo-ohms, and a leakage current of 1.5 mA. While this might be tolerable, it is still much larger than the anticipated modulator current (<10 uA), and some reduction in this figure would be helpful. An n-type shallow implant or diffusion could be made, creating a blocking junction. However, this would have added significantly to both development and production cost. An isolation implant along the amplifier-modulator and splitter-modulator boundaries would be undesirable because of the defects generated by implantation, which have a negative impact on device reliability, and act as carrier recombination centers. Likewise, wet-etched trenches running the full length of the boundary would block the light, and are thus unacceptable. However, since the light is confined to a mode with >90% of the power traveling is an 8-μm-wide area, we can etch most of the boundary, leaving a gap for light to propagate through. On the mask design, this appears as a "T" on the end of the v-groove. While this works well optically, there are several negative consequences from the standpoint of electrical leakage, and device planarity, as we shall see in the following section.

Figure 3:
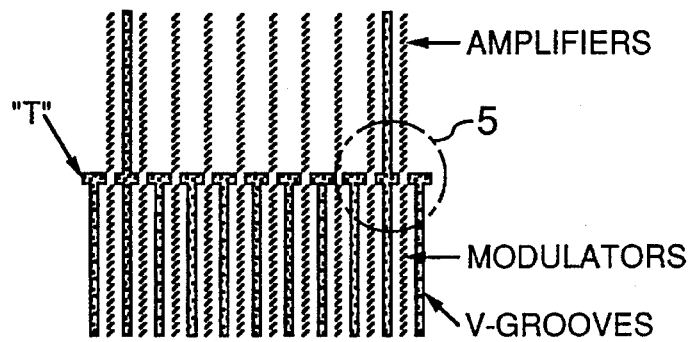
FIG. 3 is an illustration of our initial design of the present invention.

FIG. 3 shows a close-up of our original design, with straight lines following along the 110 and 1̄10 planes.

Figure 4:
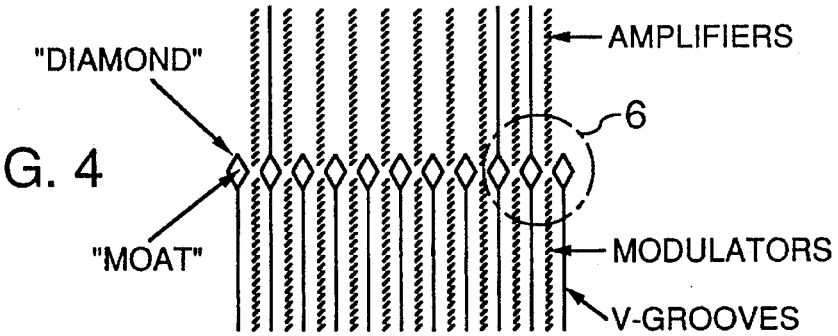
FIG. 4 is an illustration of an embodiment of the invention that is an improvement of the system of FIG. 3.

The system of FIG. 3 can be replaced by the system of FIG. 4.

Figure 5:
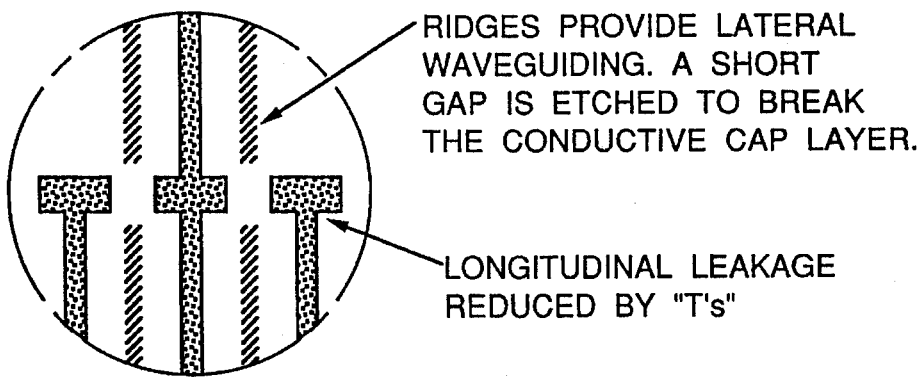
FIGS. 5 and 6 are enlarged areas of interest from FIGS. 3 and 4.
Figure 6:
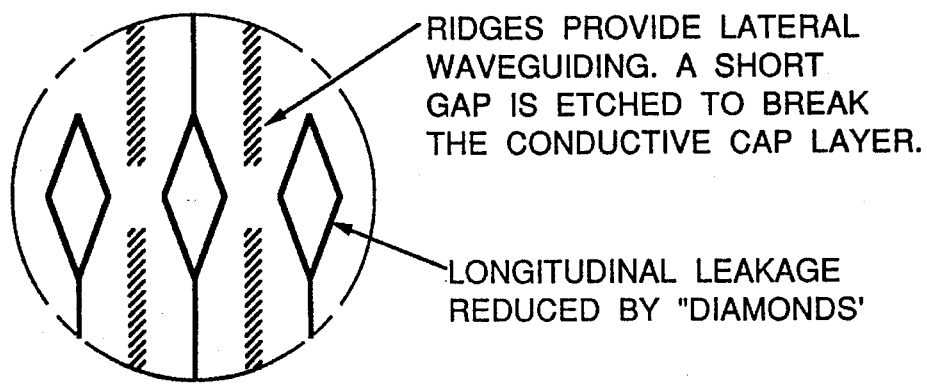

A circle surrounds an area of interest that is respectively enlarged on FIGS. 5 and 6;

FIGS. 5 and 6 are illustrations of close-ups of the mask design shows the difference between our early design (FIG. 5) and our improved design. Note that the lines travelling left-to-right (which result in undercut profiles) have been eliminated, and that the minimum areas is etched away with the new mask, where the etched material is shown in black.

Figure 7:
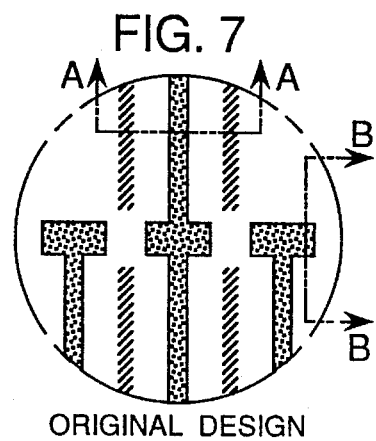
FIGS. 7 and 8 are the same as FIGS. 5 and 6, but add identifications of the views of FIGS. 9–12.

To make the v-grooves easy to etch in the original design, they were made 5 μm wide, and were etched about 1.5–2.0 m deep, to fully break the optical mode, as shown in FIG. 7. The "T"s have a 10 m width on the end. While this design appears to be easy to implement, problems are encountered when using the common self-aligned contact openings.

Figure 8:
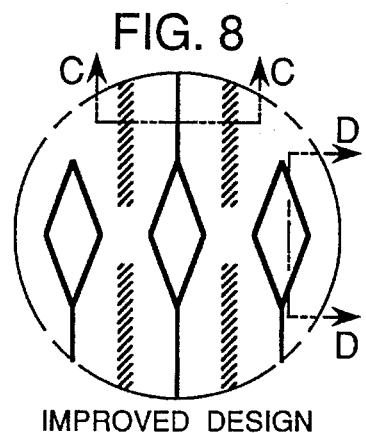
Figure 9:
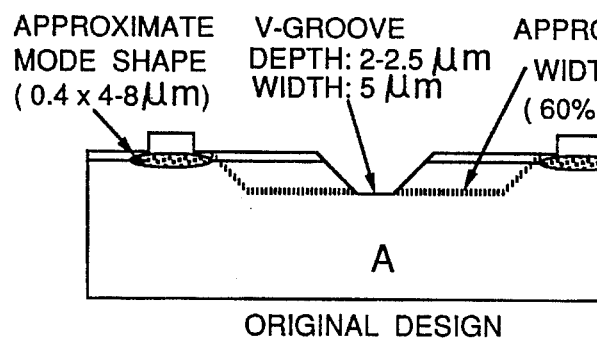
FIGS. 9–12 are side views extracted from FIGS. 7 and 8.
Figure 10:
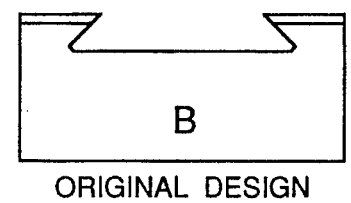
Figure 11:
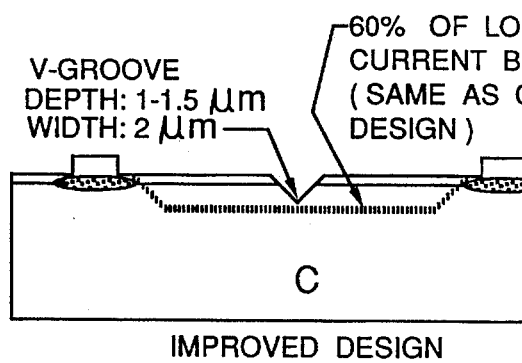
Figure 12:
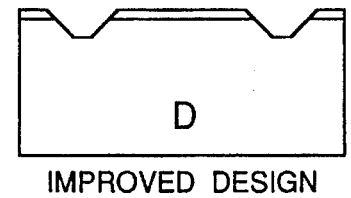

FIGS. 7 and 8 respectively depict the enlarged areas of interest of FIGS. 5 and 6 with arrows depicted as "AA", "BB", "CC", and "DD" that indicate where the views of FIGS. 9, 10, 11 and 12 are taken.

In FIG. 7, the original design has deep, wide v-grooves which make a non-planar surface. FIG. 8 shows that the improved design has shallow, narrow grooves that give a nearly-planar surface. The groove-end of the improved design has a "moat" in the middle of a diamond to minimize the volume of material etched out of the wafer and to avoid retrograde sidewalls.

Figure 13:
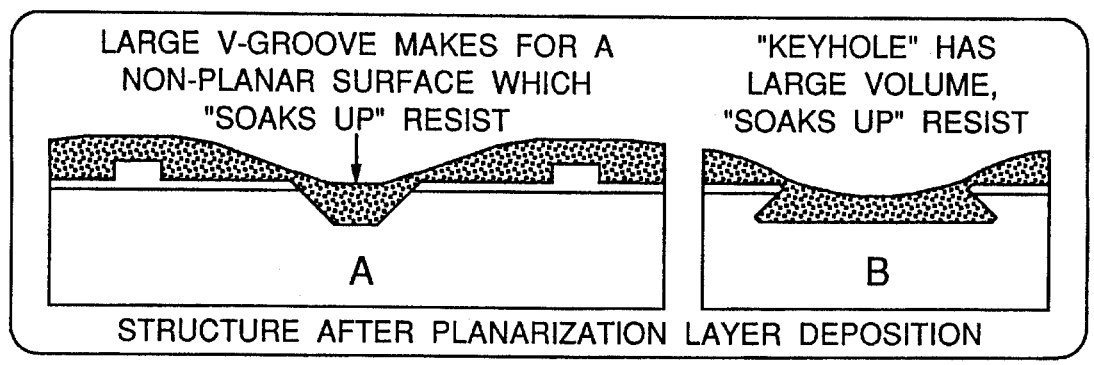
FIGS. 13–16 are segmented views of the process steps to make the system of FIG. 3.

We use a self-aligned contact opening process (SACOP) to remove our dielectric from the ridge contacts while leaving it intact elsewhere. SACOP starts with dielectric being deposited uniformly across the device, and a planarizing layer of photoresist being spun onto the wafer. The resist is thinnest on top of the ridges, where contact is desired, and thicker between ridges where isolation is desired, as shown in FIG. 13. The resist is then etched back with a uniform oxygen plasma etch, thinning the resist in the field, and removing the resist on top of the ridge. The exposed oxide on the ridge-top is then etched off, while the resist protects oxide in the field, as shown in FIG. 14.

Figure 14:
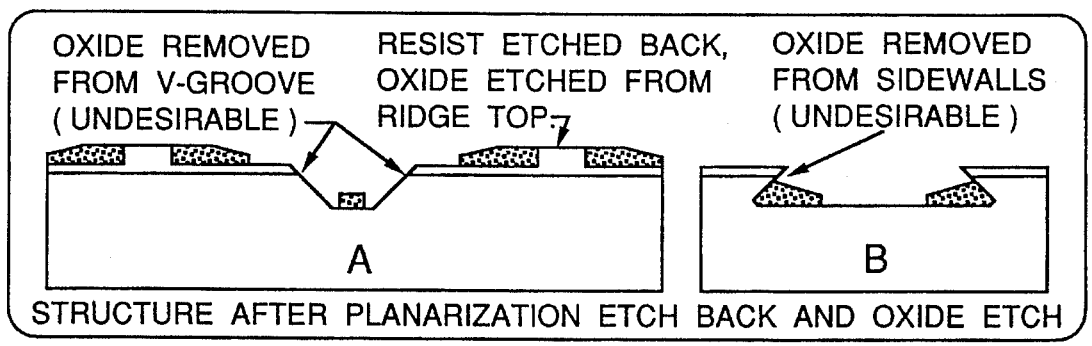
Figure 15:
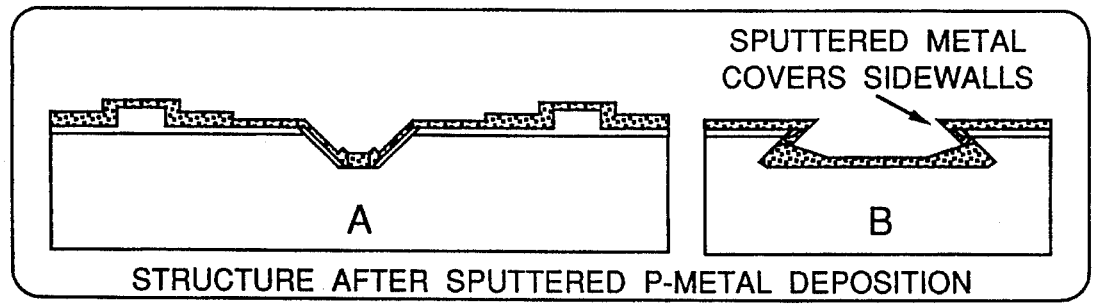

FIG. 14 shows a central island which has been added to the V-shaped groove prior to the sputtered p-metal deposition of FIG. 15.

Figure 16:
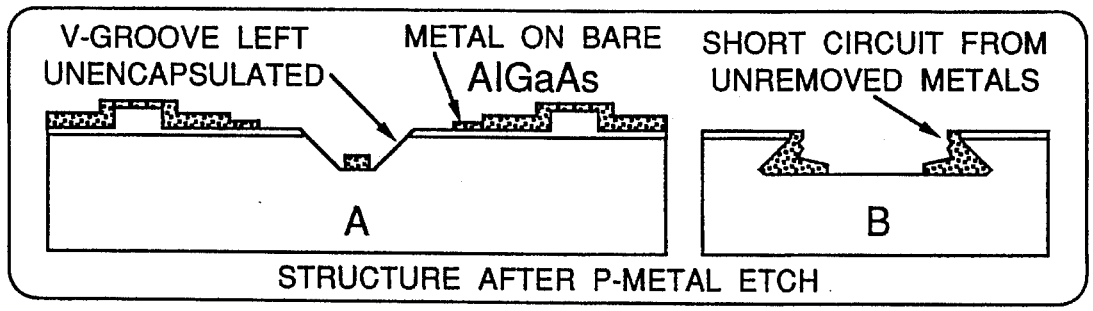
Figure 17:
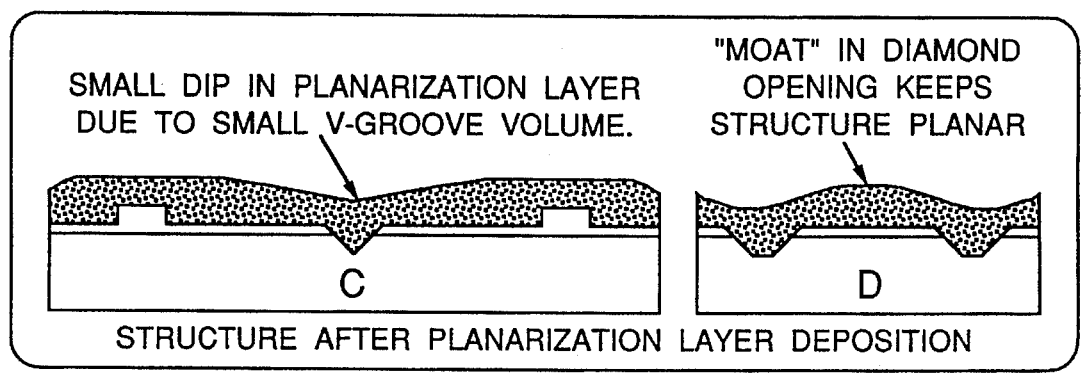
FIGS. 17–20 are segmented views of the process steps to make the system of FIG. 4.
Figure 18:
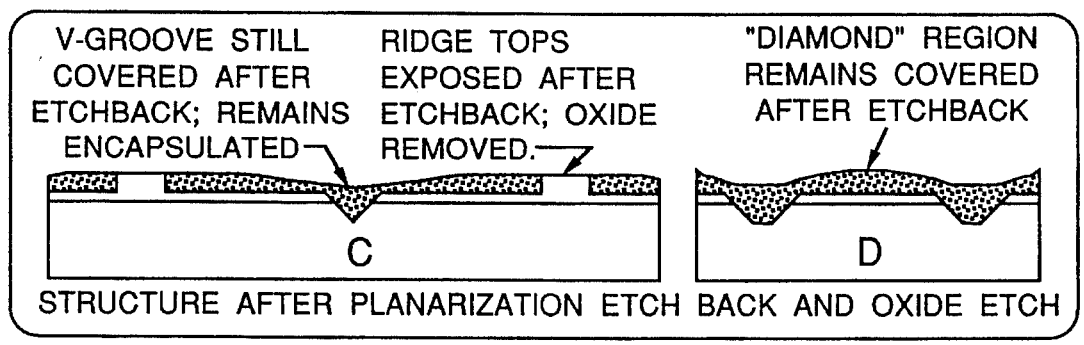
Figure 19:
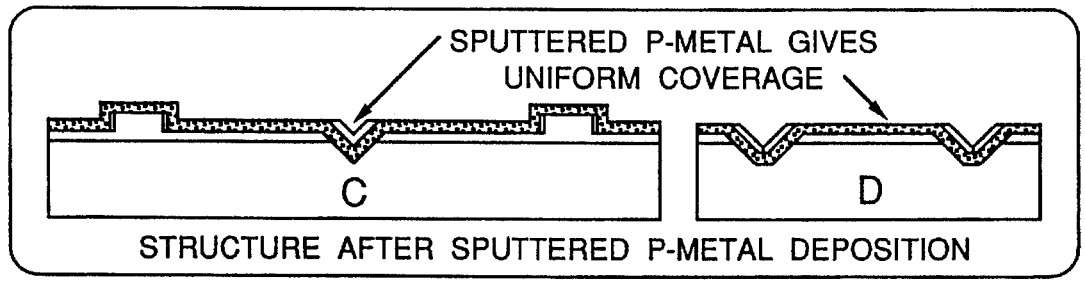
Figure 20:
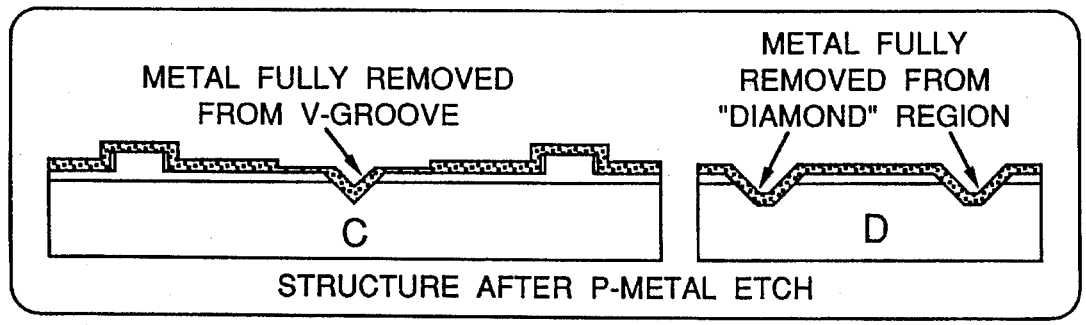

The addition of the v-grooves shown reduces the substrate's planarity, and in practice made a self-aligned contact scheme unworkable. As shown in FIG. 15 the large etched trenches capture the photoresist, leaving the walls of the v-grooves uncovered. The unencapsulated AlGaAs sidewalls oxidize, and high surface recombination velocity at the edges increases modulator current substantially. (Encapsulated sidewalls show significantly less leakage current than bare sidewalls, as is widely known from research on laser facet reliability with and without coatings) At the "T's", the retrograde sidewall design result in short circuiting due to unremoved metal coverage. Due to the topography of the ridges, we needed to use sputter-deposited p-type contact metals to obtain good sidewall coverage. This also covered the exposed junction edges along the trench, as shown in FIGS. 15 and 16. The metal pad mask then exposed the metal between contact pads to etching, but the "lip" on top of the retrograde trenches protects it from ion-mill etching in the "T", and thus leaves residual metal which short-circuits the junction. In practice this current greatly exceeds the driver's capacity, and renders the device useless.

We have thus seen that minimizing the volume of the v-grooves would be desirable to keep the substrate as planar as possible. We reduced the width of the v-grooves from 5 μm to 2 m, and decreased their depth from 1.5–2.0 μm, to the 0.5 to 1.0 μm depth needed to just break the active region. We further see that retrograde edges, which occur whenever we have lines along the 110 (or 011) direction, are undesirable. We thus replaced the "T's" between sections with diamonds. The lines used in the diamonds have somewhat steeper sidewalls than the v-grooves, but never become retrograde, since they are closer to the (desirable) 1$\overline{1}$0 direction than the retrograde 110 direction. The "moat" in the middle of the diamond minimizes the amount of material removed, keeping the surface as planar as possible, making for easy self-aligned contact mask planarization. These mask changes, as depicted in FIGS. 17–20, totally eliminated the sidewall leakage, and short circuiting by residual metal.

The mask design system and technique described herein allows users to separate regions of semiconductor devices with a simple wet etch, and still maintain sufficient device planarity to use a self-aligned contact mask. The design technique involves minimizing the amount of material removed by wet etching, and eliminating retrograde groove profiles by careful choice of the shapes chosen in the mask design. While this technique has been illustrated for optoelectronic devices, its applicability extends to electronic devices which use groove etching for isolation between adjacent sections.

While the invention has been described in its presently preferred embodiment it is understood that the words which have been used are words of description rather than words of limitation and that change within the purview of the appended claims may be made without departing from the scope and spirit of the invention in its broader aspects.

What is claimed is:

1. A mask design process for fabricating a semiconductor upon a planar substrate which has a top surface with a longitudinal length dimension and a lateral width dimension, said process comprising the steps of:

etching the planar substrate using a mask pattern onto the top surface of the planar substrate, wherein the etching step forms a plurality of v-shaped grooves that run along said longitudinal dimension and, wherein said v-shaped grooves each terminate in diamond shaped indentations which have a raised island in the center;

depositing a dielectric layer upon said semiconductor including said v-shaped grooves to reduce thereby lateral current leakage and upon said diamond shaped indentions to reduce thereby longitudinal current leakage; and a planarization step wherein said dielectric layer is etched and the semiconductor is contacted with ohmic metal contacts.

2. A mask design process, as defined in claim 1, wherein said planarization step comprises the substeps of:

a first deposition, substep which comprises depositing a planarization layer upon the dielectric layer;

a planarization etching step in which said planarization layer is etched to expose ridges of semiconductor dopants;

a second deposition substep in which metal is sputtered onto said mask pattern; and a second etching step in which said metal is etched from said mask pattern to yield said semiconductor.

* * * * *